United States Patent [19]
Matsuoka et al.

[11] Patent Number: 5,337,668
[45] Date of Patent: Aug. 16, 1994

[54] METHOD OF AND APPARATUS FOR PRODUCING REGISTER MARK PATTERN

[75] Inventors: Kazuyuki Matsuoka; Yasuhisa Fujimoto, both of Kamikyo, Japan

[73] Assignee: Dainippon Screen Mtg. Co., Ltd., Kyoto, Japan

[21] Appl. No.: 151,247

[22] Filed: Nov. 12, 1993

[30] Foreign Application Priority Data

Nov. 19, 1992 [JP] Japan .................................. 4-335580

[51] Int. Cl.$^5$ .............................................. B41F 1/34
[52] U.S. Cl. ........................................ 101/481; 33/614
[58] Field of Search ....... 101/481, 485, 486, DIG. 36; 33/614–623; 395/101; 364/226

[56] References Cited
U.S. PATENT DOCUMENTS 4,887,530 12/1989 Sainio ................................. 101/486
5,031,334 7/1991 Takamura ............................. 33/614
5,226,366 7/1993 Schlife et al. ....................... 101/485

Primary Examiner—David A. Wiecking
Assistant Examiner—Steven S. Kelley
Attorney, Agent, or Firm—Lowe, Price, LeBlanc & Becker

[57] ABSTRACT

Plural types of register mark configurations are displayed in window W1, and a specified page layout pattern is displayed in window W2. A plurality of register mark candidate positions, which can be decided according to the page layout pattern, are also displayed in window W2. The operator selects one of the register mark configurations available and also selects a register mark candidate position to locate the register mark. The selected register mark will be located at the selected candidate position after rotation by the specified rotation angle.

15 Claims, 12 Drawing Sheets

Fig. 2(A)  REGISTER MARK TYPES
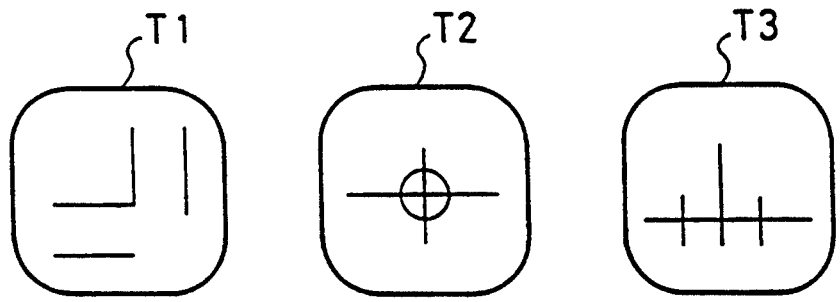
Fig. 2(B)  END POINTS OF REGISTER MARK CONFIGURATION VECTORS
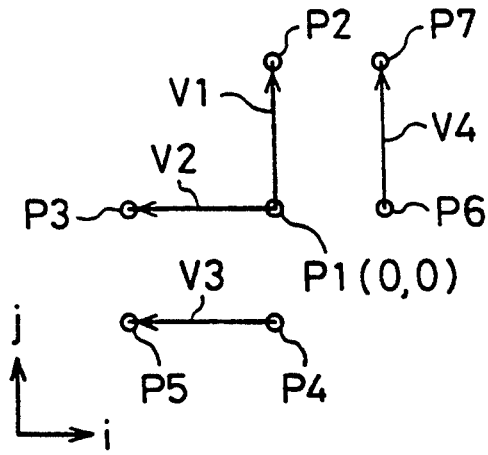
Fig. 2(C)  REGISTER MARK CONFIGURATION DATA
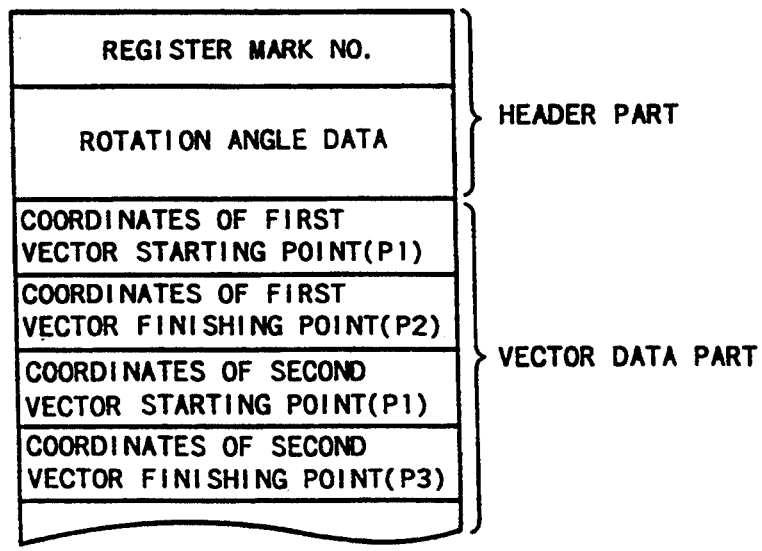

Fig. 5

REGISTER MARK POSITION INFORMATION TABLE

| DATA CAND. POSITION | X COORDINATE | Y COORDINATE | ROTATION ANGLE θ (⌐) | ROTATION ANGLE θ (⊕) | ROTATION ANGLE θ (+) |
|---|---|---|---|---|---|
| Q00 | 0 | 0 | 90° | 0° | 0° |
| Q10 | Sx + Wx + ½Gx | 0 | 0° | 0° | REVERSE |
| Q20 | Sx + 2Wx + 3/2Gx | 0 | 0° | 0° | REVERSE |
| Q30 | Sx + 3Wx + 5/2Gx | 0 | 0° | 0° | REVERSE |
| Q40 | Sx + 4Wx + 7/2Gx | 0 | 180° | 0° | N/A |
| Q01 | 0 | Sy + Wy + ½Gy | N/A | 90° | 90° |

Fig. 11(A)
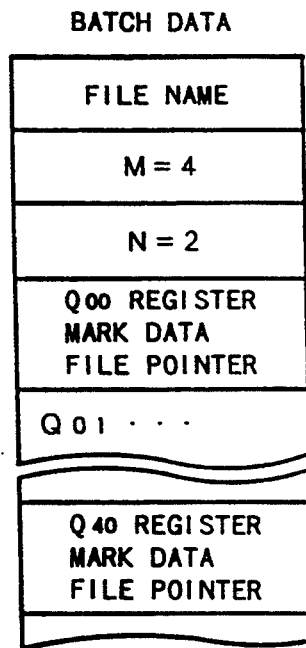
Fig. 11(B)
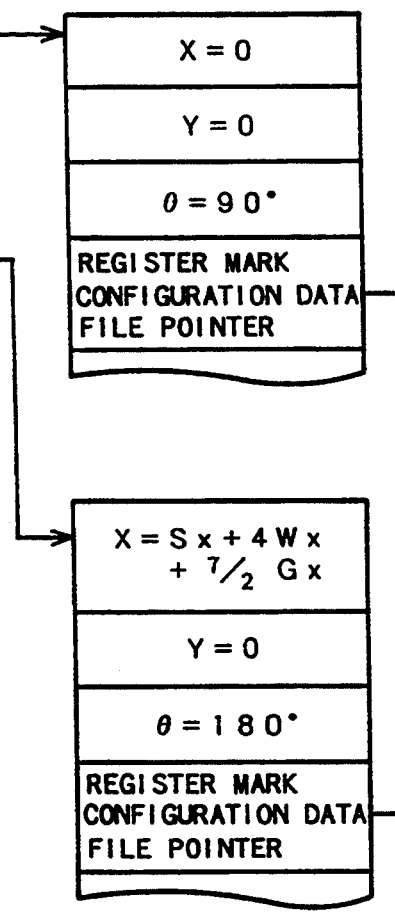
Fig. 11(C)

Fig. 12(A)

REGISTER MARK POSITION INFORMATION TABLE

| DATA<br>CAND.<br>POSI-<br>TION | ROTATION ANGLE θ | | | |
|---|---|---|---|---|
| | CORNER REGISTER MARK GROUP 1 | CORNER REGISTER MARK GROUP 2 | CENTER REGISTER MARK GROUP 1 | CENTER REGISTER MARK GROUP 2 |
| $Q_{00}$ | 90° | x-AXIS REVERSE | 0° | N/A |
| $Q_{10}$ | N/A | 0° | 0° | x-AXIS REVERSE |
| $Q_{20}$ | N/A | 0° | 0° | x-AXIS REVERSE |
| $Q_{30}$ | N/A | 0° | 0° | x-AXIS REVERSE |
| $Q_{40}$ | 180° | y=x LINE REVERSE | 0° | N/A |
| $Q_{01}$ | N/A | 0° | 0° | 90° |

Fig. 12(B)
CORNER REGISTER MARK GROUP 1

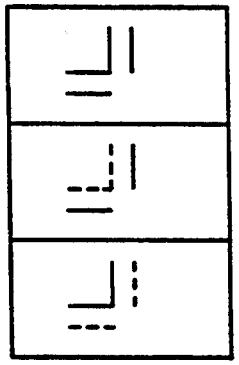

Fig. 12(C)
CORNER REGISTER MARK GROUP 2

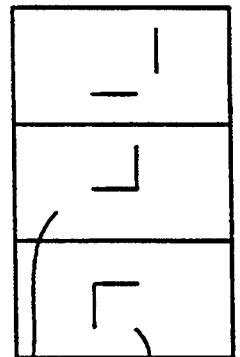

CT1   CT2

Fig. 12(D)
CENTER REGISTER MARK GROUP 1

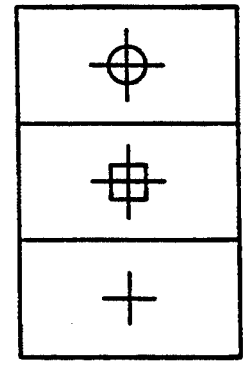

Fig. 12(E)
CENTER REGISTER MARK GROUP 2

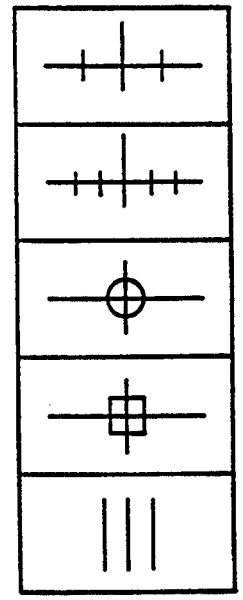

METHOD OF AND APPARATUS FOR PRODUCING REGISTER MARK PATTERN

DETAILED DESCRIPTION OF THE INVENTION

1. Industrial Field of the Invention

The present invention relates to a method of and an apparatus for producing register patterns utilized in the printing and plate-making processes.

2. Description of the Related Art

Register marks are used to align a plurality of plates in the printing, cutting, folding and inspection processes of the printing and plate-making processes; triple cross marks, cross-circle marks and square corner marks are often used in the photographic plate-making process. On a sheet of paper for printing, the areas to be printed as final products are laid out in a matrix of $M \times N$, and the register marks are laid out around and between them. The configuration and position of the register marks and also the mark directions which are decided by their positions differ by the page layout patterns and also by the kind of printed matter (books, bills, packages, etc.). Therefore, it has been the conventional method to prepare more than one type of register mark base sheet data beforehand which expresses the register mark base sheets on which the desired configuration of register marks is laid out in the desired positions according to the page layout patterns, and then to select one for actual use.

There may be cases where the preparation of a new register mark base sheet is desired due to changes in the register mark configuration or layout or in the page layout matrix. No simple device for remaking the register mark base sheet data has been known. This problem is common to the register mark patterns which express the patterns of the register marks on printed sheet images.

SUMMARY OF THE INVENTION

An object of the present invention is to easily prepare a new register mark pattern.

The present invention is directed to a method of producing a register mark pattern which is an arrangement of a plurality of register marks on a printing sheet area with the aid of a computer. The method comprises the steps of: (a) preparing register mark configuration data representing a plurality of register mark configurations; (b) specifying the number of columns M and the number of rows N indicating an $M \times N$ array of pages to be laid out on the printing sheet area; (c) determining a plurality of register mark candidate positions on the printing sheet area according to the numbers M and N; (d) displaying a page layout pattern and a register mark selection window on a display device, the page layout pattern including page symbols arranged in the $M \times N$ array and the plurality of register mark candidate positions laid out on the printing sheet area, the register mark selection window including representations of the plurality of register mark configurations; (e) selecting one of the plurality of register mark configurations displayed in the register mark selection window for at least part of the plurality of register mark candidate positions; (f) determining a rotation angle for each of the selected register mark configurations according to rotation angle data prepared in advance for the respective plurality of register mark configurations and according to a positional category of the register mark candidate position to which the selected register mark configuration is assigned, the rotation angle data indicating a rotation angle with respect to each positional category of the register mark candidate positions; and (g) producing register mark pattern data representing the selected register mark configurations disposed at the at least part of the plurality of register mark candidate positions on the printing sheet area, the selected register mark configurations being rotated by the respective rotation angles.

In a preferred embodiment of the present invention, the step (c) comprises the step of: expressing coordinates of each of the plurality of register mark candidate positions on the printing sheet area with a plurality of positional parameters each having a default value.

Preferably, the positional parameters include a distance between the register mark candidate positions and the pages to be laid out in the $M \times N$ array, the dimensions of the pages, and a distance between the pages themselves.

According to an aspect of the present invention, the step (c) comprises the step of: producing register mark information including coordinates of each of the plurality of register mark candidate positions and the rotation angle data for the respective plurality of register mark configurations at each of the plurality of register mark candidate positions.

Alternatively, the step (c) comprises the step of: producing register mark information including coordinates of each of the plurality of register mark candidate positions and the rotation angle data for respective groups of the plurality of register mark configurations at each of the plurality of register mark candidate positions, each of the groups including at least one register mark configuration to which an identical rotational angle is applied.

The present invention is also directed to an apparatus for preparing a register mark pattern which is an arrangement of register marks on a printing sheet area. The apparatus comprises: a first memory for storing register mark configuration data representing a plurality of register mark configurations; a first input means for specifying the number of columns M and the number of rows N indicating an $M \times N$ array of pages to be laid out on the printing sheet area; candidate position establishing means for establishing a plurality of register mark candidate positions on the printing sheet area according to the numbers M and N, and determining rotation angles for the respective plurality of register mark configurations at each of the plurality of register mark candidate positions; a second memory for storing the plurality of register mark candidate positions and the rotation angles for the respective plurality of register mark configurations at each of the plurality of register mark candidate positions; a display device for displaying a page layout pattern and a register mark selection window, the page layout pattern including page symbols arranged in the $M \times N$ array and the plurality of register mark candidate positions laid out on the printing sheet area, the register mark selection window including representations of the plurality of register mark configurations; a second input means for selecting one of the plurality of register mark configurations displayed in the register mark display window, and selecting one of the plurality of register mark candidate positions to which the selected register mark configuration is assigned; and register pattern data production means for producing register pattern data representing the selected register mark configurations disposed with the respective rotation angles at the plurality of register mark candidate positions on the printing sheet area.

The present invention is further directed to an apparatus for producing a register mark pattern which is an arrangement of a plurality of register marks on a printing sheet area, comprising: a memory for storing register mark configuration data representing a plurality of register mark configurations; first input means for specifying the number of columns M and the number of rows N indicating an M×N array of pages to be laid out on the printing sheet area; candidate position determining means for determining a plurality of register mark candidate positions on the printing sheet area according to the numbers M and N; a display device for displaying a page layout pattern and a register mark selection window, the page layout pattern including page symbols arranged in the M×N array and the plurality of register mark candidate positions laid out on the printing sheet area, the register mark selection window including representations of the plurality of register mark configurations; second input means for selecting one of the plurality of register mark configurations displayed in the register mark selection window for at least part of the plurality of register mark candidate positions; means for determining a rotation angle for each of the selected register mark configurations according to rotation angle data prepared in advance for the respective plurality of register mark configurations and according to a positional category of the register mark candidate position to which the selected register mark configuration is assigned, the rotation angle data indicating a rotation angle with respect to each positional category of the register mark candidate positions; and means for producing register pattern data representing the selected register mark configurations disposed with the respective rotation angles at the at least part of the plurality of register mark candidate positions on the printing sheet area.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2(A) through 2(C) illustrate register mark configurations;

FIG. 5 is a conceptual chart showing the register mark position information which is prepared by the register mark position information preparation part;

FIGS. 11(A) through 11(C) schematically illustrate the structure of the register mark pattern data; and FIGS. 12(A) through 12(E) show another example of the register mark position information table.

DESCRIPTION OF THE PREFERRED EMBODIMENT

Figure 1:
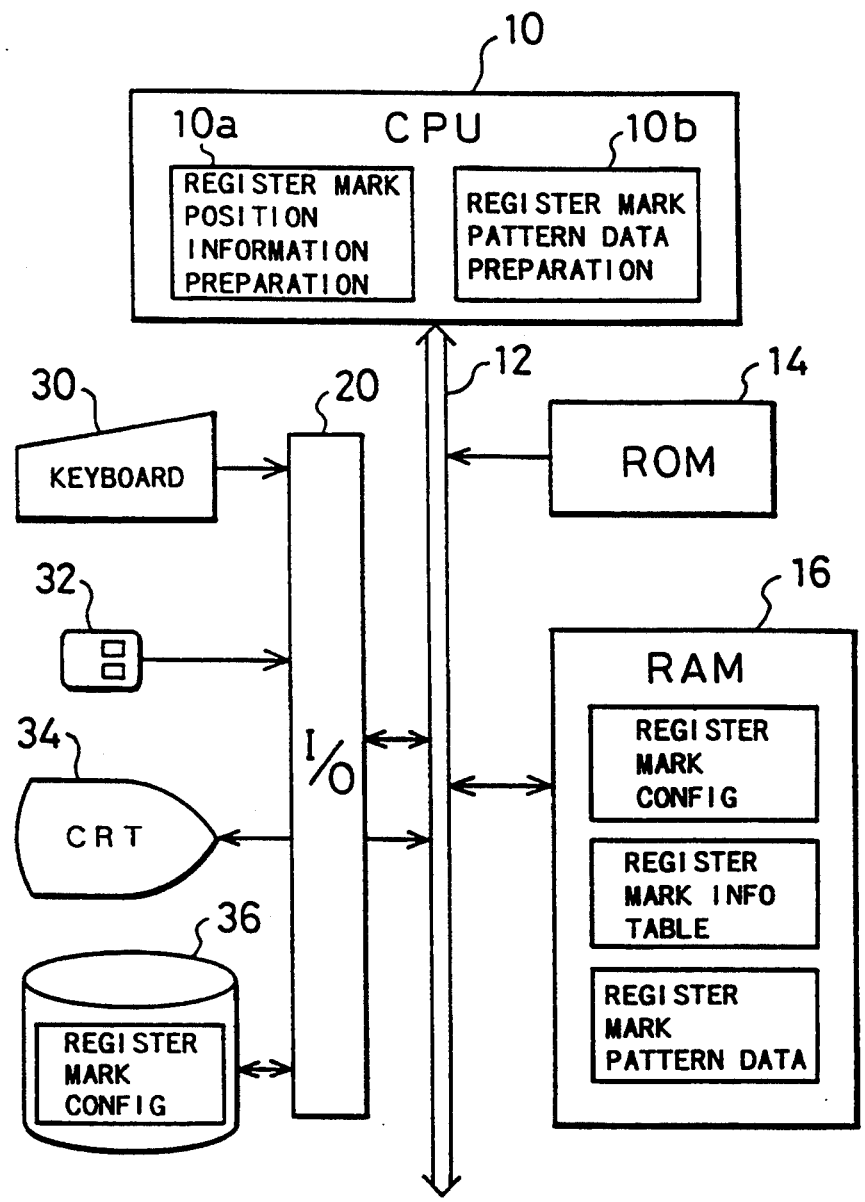
FIG. 1 is a block diagram showing the register mark pattern data preparation device as an embodiment of the present invention.

FIG. 1 is a block diagram showing the register mark pattern data preparation device as an embodiment of the present invention. The register mark pattern data preparation device comprises a CPU 10 and a bus line 12. The bus line is connected to a ROM 14 and a RAM 16, and is also connected to a keyboard 30, a mouse 32, a color CRT 34 and a magnetic disk 36 via an input-output interface 20.

The RAM 16 corresponds to the first and the second memories of the present invention. The keyboard 30 corresponds to the first input means; the mouse 32 corresponds to the second input means and the CRT 34 corresponds to the display device. A register mark position information preparation part 10a and a register mark pattern data preparation part 10b, which are implemented by the CPU 10 executing software programs stored in the ROM 14, correspond to the candidate position establishment means and means for producing register mark pattern data. The register mark information preparation part 10a and the register mark pattern data preparation part 10b can be embodied as hardware circuitry.

The RAM 16 stores the register mark configuration data read out from the magnetic disk 36. FIGS. 2(A) through 2(C) illustrate several types of register mark configurations which are prepared in advance, and the structure of the register mark configuration data which expresses the register mark configurations. Three types of register marks T1 through T3 shown in FIG. 2(A) are available for this embodiment. FIG. 2(B) shows the register-mark configuration vectors V1 through V4 which constitutes the first type of register mark T1, and the end points P1 through P7 of the vectors V1 through V4. As shown in FIG. 2(C), the register mark configuration data concerning the first type of register mark comprises a header part and a vector data part. The header part includes a register mark number to specify the type of register mark, and the rotation angle data (described below). The vector data part includes the respective coordinates of the starting points and finishing points of vectors V1 through V4. The end point P1 in FIG. 2(B) is the reference point for this register mark, and the coordinates for the other end points are provided as coordinates with the reference point P1 as the point of origin. Regarding register marks which have identical configurations by rotation, configuration in one direction only will be stored as the register mark configuration data. The position of the reference point can be established arbitrarily.

Figure 3:
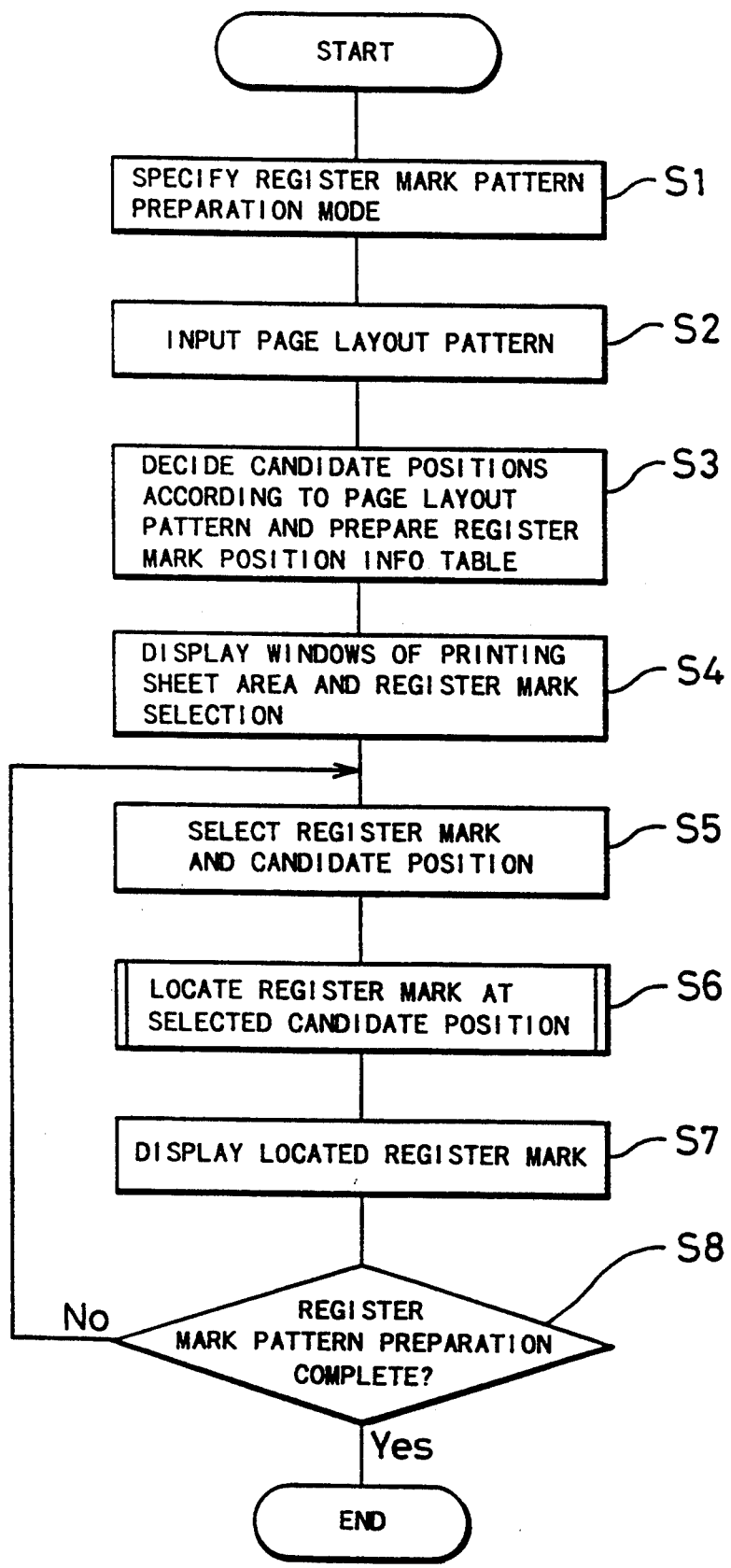
FIG. 3 is a flowchart showing the procedures for newly preparing a register mark pattern.

FIG. 3 is a flow chart showing the procedures for preparing a new register mark pattern. In step S1, the operator uses the keyboard 30 or the mouse 32 to specify the start of the register mark pattern preparation mode. In step S2, the operator specifies values of integers M and N, which represent a page layout pattern consisting of an M×N array of pages. In this embodiment, M and N are four and two, respectively.

Figure 4:
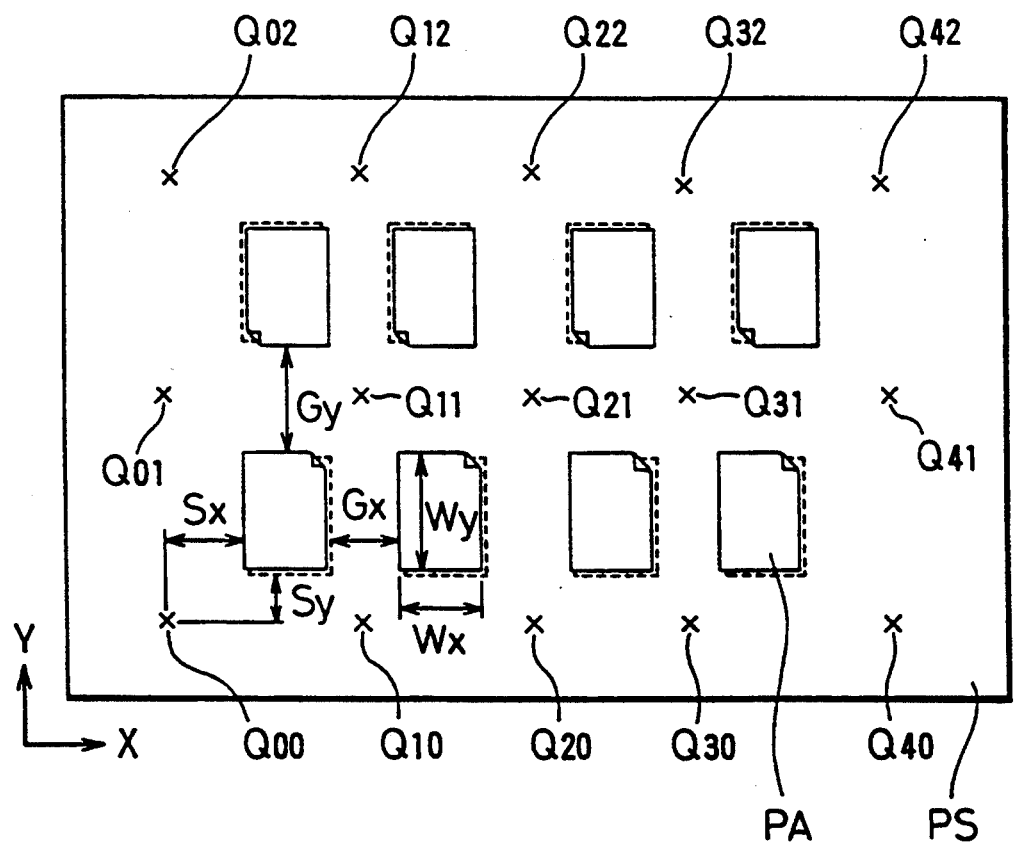
FIG. 4 is an illustrative chart showing a page layout pattern and the register mark positions.

In step S3, the register mark position information preparation part 10a decides the register mark candidate positions according to the specified page layout pattern, and produces a register mark position information table which includes the data concerning each of the register mark candidate positions. FIG. 4 illustrates the page layout pattern and the register mark candidate positions. In FIG. 4, eight printing areas PA are arranged in two four-page rows over the printing sheet area PS. A 5×3 array of register mark candidate positions Q00 thgourh Q40, Q01 through Q41, and Q02 through Q42 are arranged around the printing areas PA and along imaginary center lines between the printing areas PA.

FIG. 5 is a conceptual chart of the register mark position information table produced by the register mark position information preparation part 10a. The register mark position information table includes the respective coordinates of the fifteen candidate positions Q00 through Q42, and three rotation angles $\theta$ for the respective three register marks at each candidate position. For example, the coordinates of the first candidate position Q00, which is in the lower left of the printing sheet area PS, are (0, 0) and the rotation angles $\theta$ for the three register marks are 90°, 0° and 0°, respectively. The coordinates of the second candidate position Q10 are $$\left( Sx + Wx + \frac{Gx}{2}, 0 \right).$$

As FIG. 4 shows, Sx and Sy are spaces between the register marks and the printing areas PA; Wx and Wy are the dimensions of the printing areas PA; and Gx and Gy are the spaces between the printing areas PA. Thus the coordinates of the candidate positions are expressed with parameters Sx, Sy, Wx, Wy, Gx and Gy, and are calculated by the register mark information preparation part 10a based on the integers M and N indicating the numbers of columns and rows of the page layout pattern. When the image shown in FIG. 4 is displayed on the color CRT 34, however, predetermined values, or default values, for these parameters Sx, Sy, Wx, Wy, Gx and Gy are adopted.

The rotation angles of the third register mark at the second through the fourth candidate positions Q10, Q20 and Q30 are registered as "reverse" as shown in FIG. 5. The description "reverse" means $\theta = 180°$. The rotation angle of the fifth candidate position Q40 is registered as "N/A". "N/A" stands for "Not Available", and it means that this type of register mark cannot be positioned at that candidate position.

Figure 6:
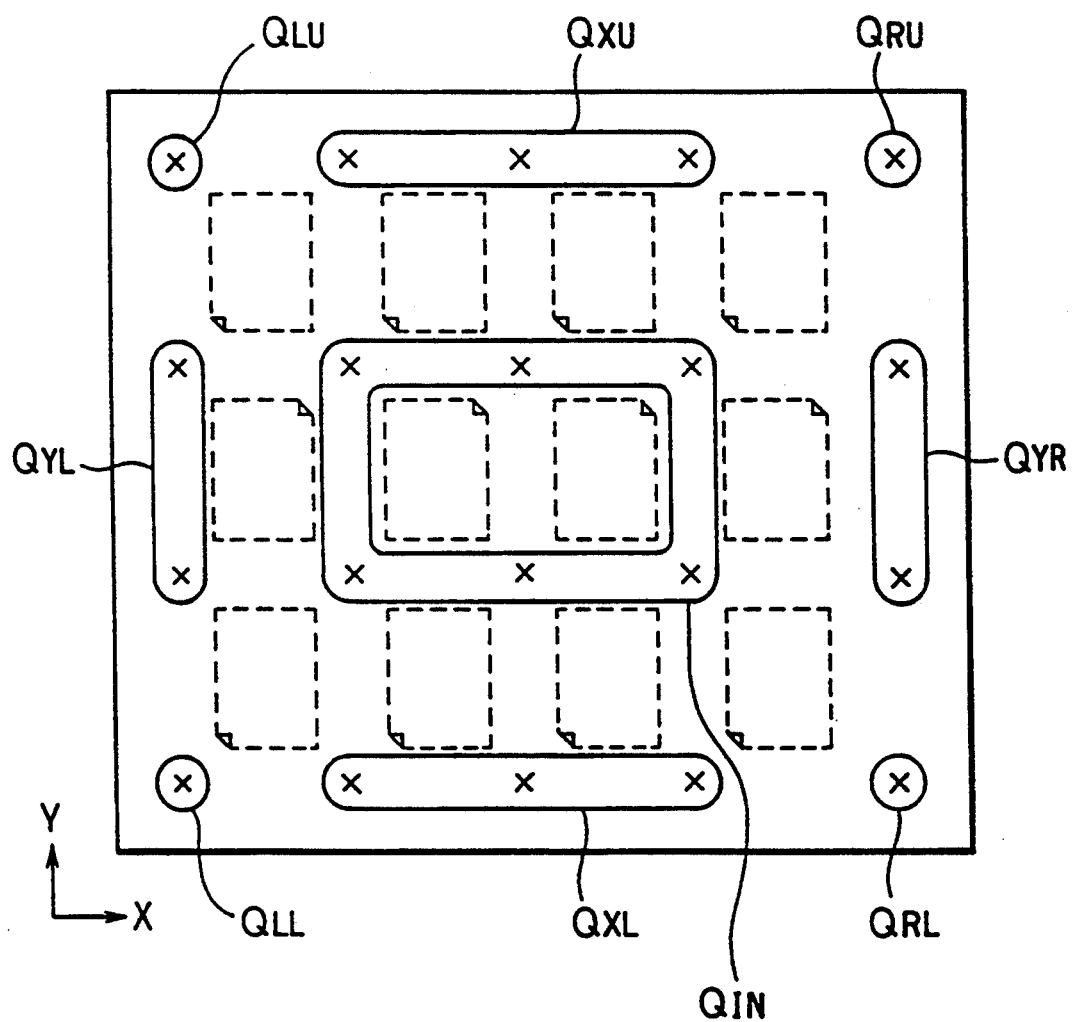
FIG. 6 is an illustrative chart showing the categorization of the register mark candidate positions in an ordinary page layout pattern.

The rotation angle data which indicates how each of the rotation angles $\theta$ are set up at each candidate position is registered beforehand in the header part of the register mark configuration data shown in FIG. 2(C). The rotation angle $\theta$ is established according to the categories of the candidate positions inside the printing sheet area PS. FIG. 6 illustrates the categories of the register mark candidate positions in a general page layout pattern. The register mark candidate positions are classified into the following nine categories as shown in FIG. 6 where each category is surrounded by a solid-lined circle:

(1) Head left position: QLU
(2) Head right position: QRU
(3) Foot left position: QLL
(4) Foot right position: QRL
(5) Head peripheral position parallel to the X direction: QXU
(6) Foot peripheral position parallel to the X direction: QXL
(7) Left side position parallel to the Y direction: QYL
(8) Right side position parallel to the Y direction: QYR
(9) Internal position: QIN As for the register mark T2 shown in FIG. 2(A), for example, the rotation angle $\theta$ is 0° at the positional categories QLU, QXU, QRU, QIN, QLL, QXL, and QRL while it is 90° at the categories QYL and QYR. Any categorization or classification other than the above can be adopted in the present invention.

When the number of columns M and the number of rows N of a page layout is specified that M=4 and N=2, the register mark position information part 10a sets up the register mark candidate positions Q00, Q01 through Q42 shown in FIG. 4 and also decides the rotation angles $\theta$ according to the classification in FIG. 6.

Figure 7:
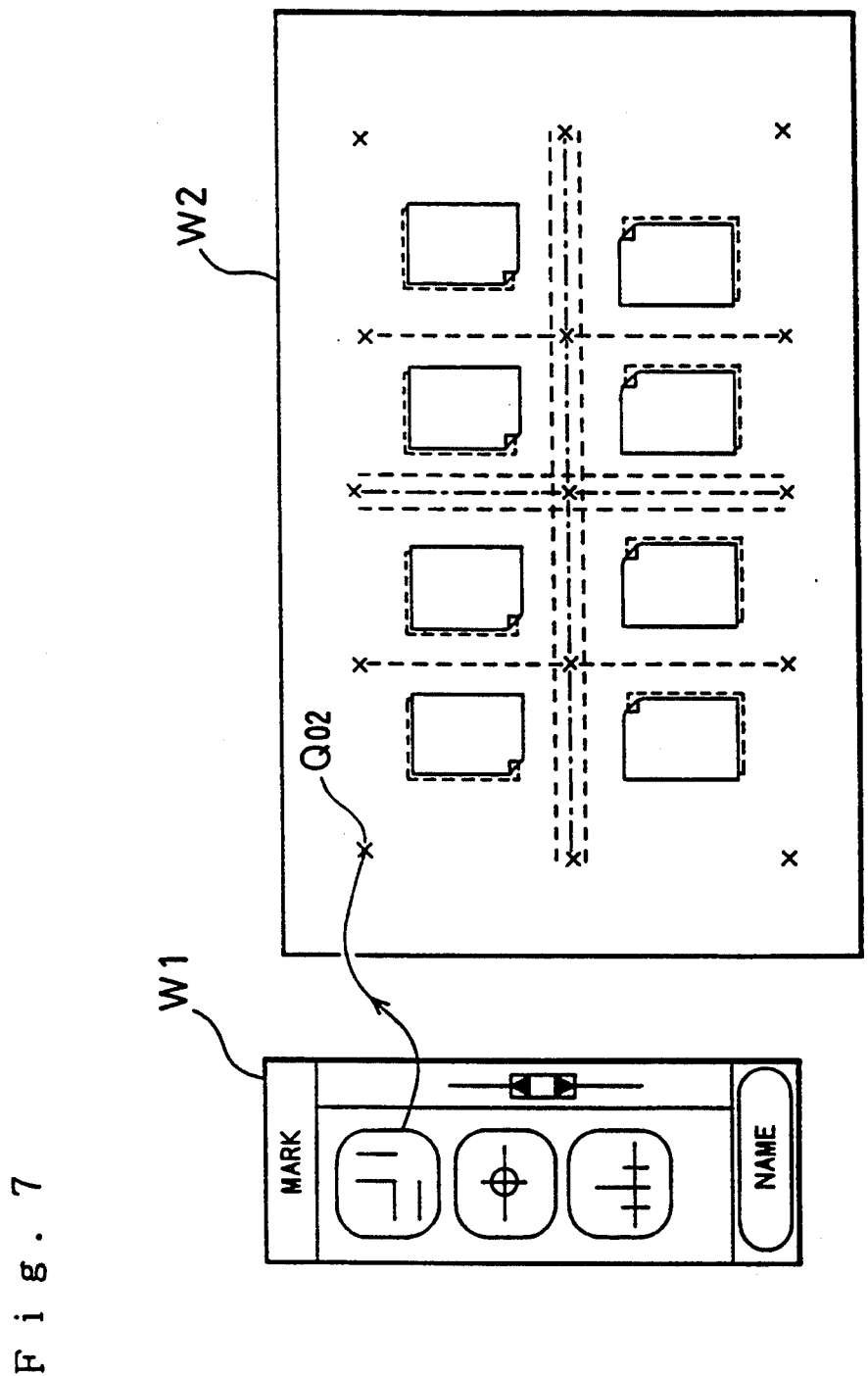
FIG. 7 is an illustrative chart showing how to select from more than one type of register marks and register mark candidate positions.

In step S4 in FIG. 3, as shown in FIG. 7, the first window W1 for the selection of the register mark type and the second window for showing the printing sheet area which contains the register mark candidate positions Q00, Q01 through Q42 are displayed on the color CRT 34. The broken lines and one-dot broken lines in FIG. 7 are auxiliary lines to show folding lines or cutting positions. These auxiliary lines need not always be displayed.

In step S5, the operator selects one register mark from those in the first window W1 and also selects a candidate position for arrangement of the register mark in the second window W2. These selections are executed, for example, by pressing the button of the mouse 32 over one of the register marks in the first window W1 and, after sliding the mouse to the vicinity of the desired register mark candidate position (for example, Q02) in the second window W2 while holding down the mouse button, and then releasing the button. If the register mark is designated to be located in a register mark candidate position registered as "N/A" (not available) in the register mark position information table, a warning to indicate that the location is N/A will be displayed on the color CRT.

Figure 8:
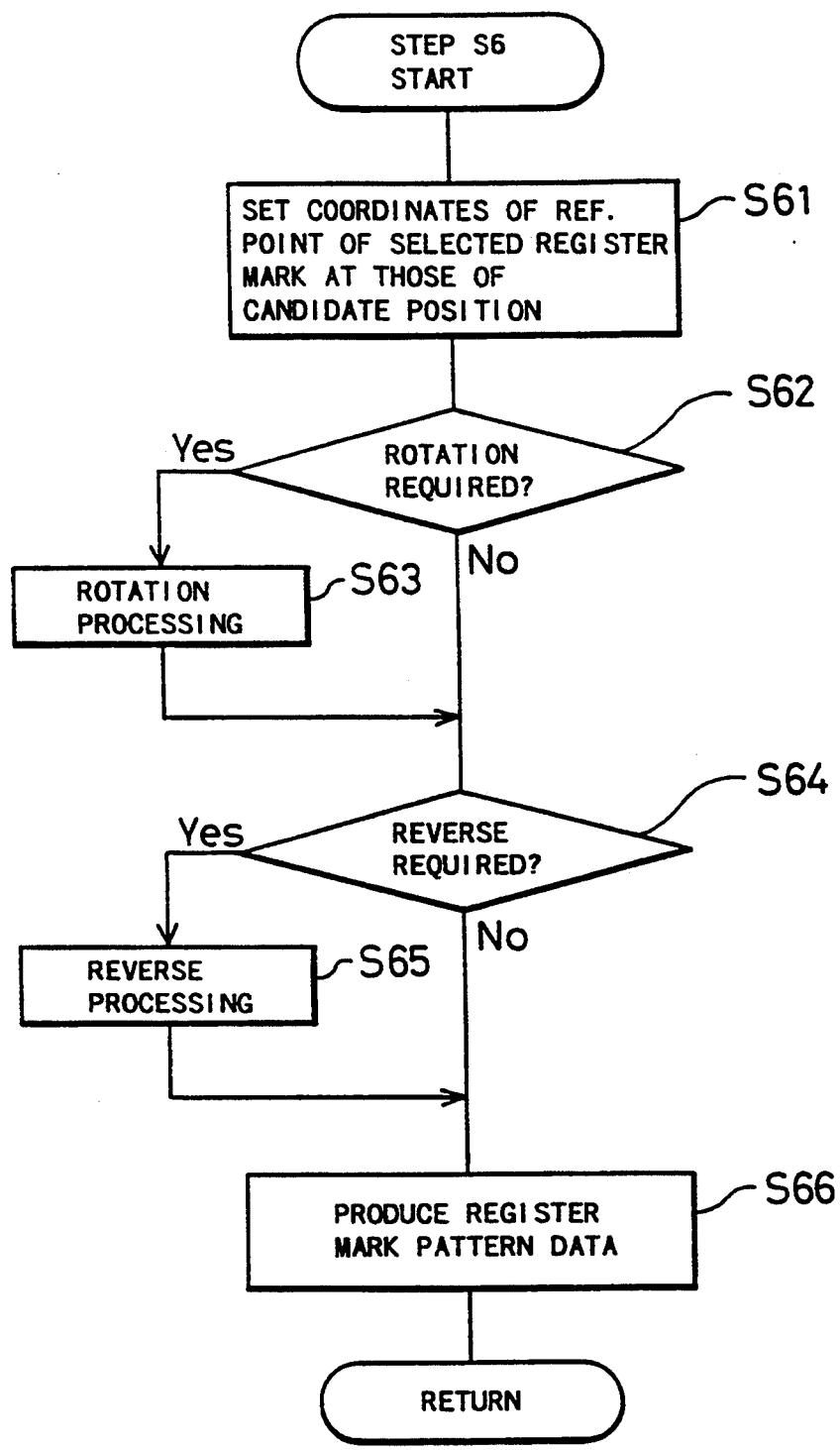
FIG. 8 is a flow chart showing the detailed procedures of step S6.
Figure 9:
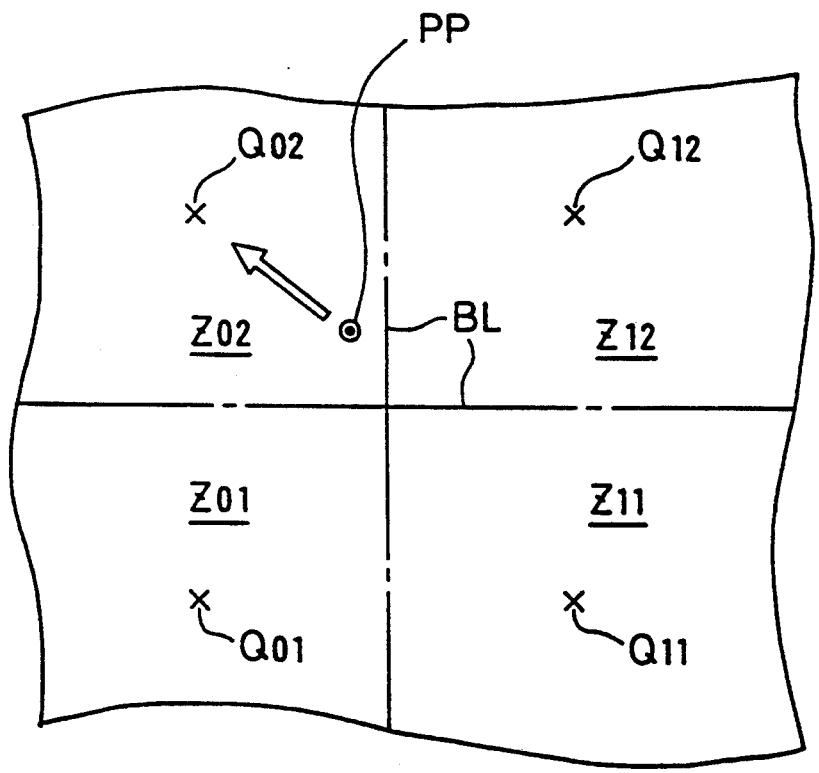
FIG. 9 is an illustrative chart showing a technique to slide a mouse cursor to the register mark candidate position.

In step S6, the register mark pattern data preparation part 10a locates the selected register marks to the selected register mark candidate positions. FIG. 8 is a flow chart showing the detailed procedures of step S6. In step S61, the reference point of the selected register mark (point P1 in the example in FIG. 2(B)) is positioned at the coordinates of the selected candidate position (X, Y). The "selected candidate position" is the candidate position Q02 (FIG. 7) which is the closest to the mouse cursor position when the mouse button is released in step S5, and the reference point of the selected register mark is slid into this candidate position Q21. The mouse cursor slip-in technique is executed, for example, as shown in FIG. 9. The area surrounding the candidate positions Q02, Q12, Q01 and Q11 in FIG. 9 is divided in advance into zones Z02, Z12, Z01 and Z00 by the boundary lines BL which are in the intermediate positions between the candidate positions. The candidate position to be slipped-in is decided by the zone to which the mouse cursor PP belongs when the mouse button is released. For example, if the mouse cursor is in zone Z02, the reference point of the register mark is slid into the candidate position Q02 which corresponds to zone Z02.

In steps S62 through S65 in FIG. 8, rotation processing or reverse processing is executed for the register mark configuration data, according to the rotation angles θ registered in the register mark position information table shown in FIG. 5. The register mark configuration data can be easily reversed or rotated since it is the vector data as shown in FIG. 2(C).

After the position and rotation angle of the selected register mark has been decided, the register mark pattern data to express the register mark layout on the printing sheet area is prepared and stored in the RAM 16 in step S66.

In step S7 in FIG. 3, the laid-out register marks are displayed in the second window W2 shown in FIG. 7. To continue the register mark layout operation, the processing returns from step S8 back to step S5, and the processes in steps S5 through S7 described above are repeated.

Figure 10:
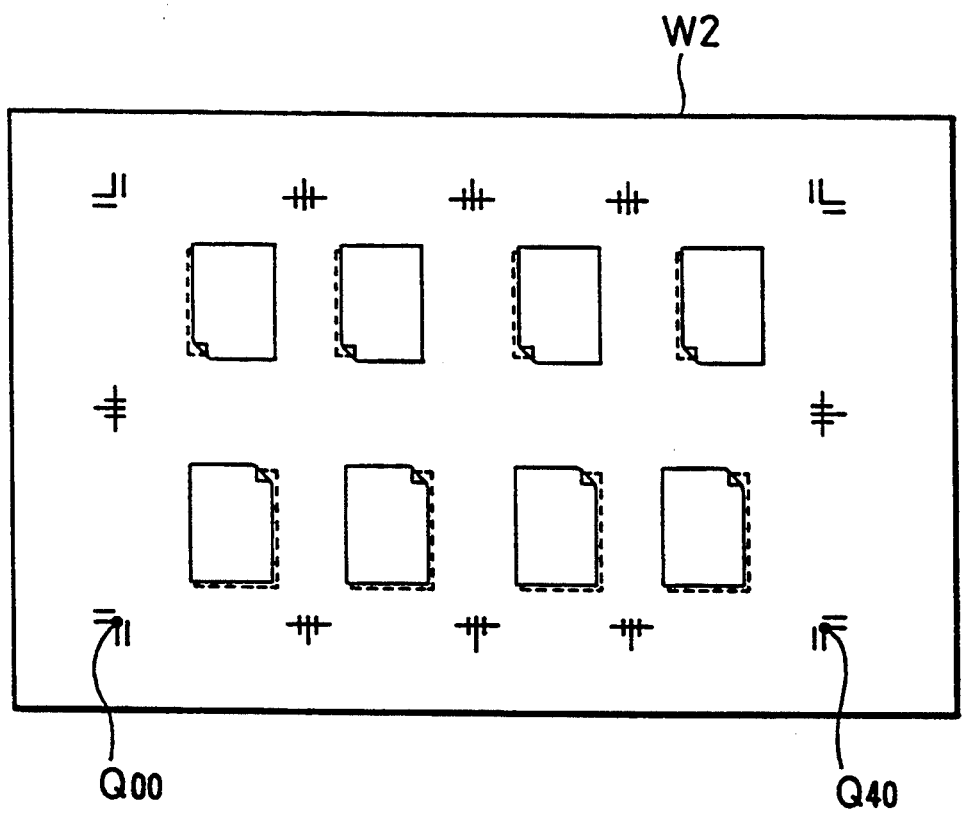
FIG. 10 is an illustrative chart showing an example of a finished register mark pattern.

FIG. 10 shows an example of the finished register mark pattern and FIGS. 11(A) through 11(C) show the structure of the register mark pattern data which expresses this register mark pattern. The register mark pattern data includes batch data shown in FIG. 11(A), position-related data shown in FIG. 11(B) and register mark configuration data shown in FIG. 11(C). The batch data comprises a file name of the register mark pattern data, the number of columns M and the number of rows N of the page layout, and a pointer for the position-related data file. The position-related data comprises the coordinates of the position where the register mark is located (X, Y), the rotation angle θ of the register mark, and the pointer of the register mark configuration data file. The register mark configuration data is the same as the data shown in FIG. 2(C). Since the same type of register marks are located in the candidate positions Q00 and Q40 as shown in FIG. 11, their register mark configuration data file pointers indicate the same data file, but their coordinates (X, Y) and the rotation angles θ are different.

As FIG. 11(B) also shows, the coordinates in the position-related data file are expressed with parameters Sx, Sy, Wx, Wy, Gx and Gy; therefore, the register mark arrangement can be adjusted by substituting these parameters with desired values when the register mark pattern is actually used.

As described above, when the numbers of columns and rows are specified for a layout of the page arrangement, the layout and the register mark candidate positions are automatically displayed on the CRT 34. Next, when the type of register mark and the register mark candidate position are selected, the register mark is disposed at the candidate position while being rotated by the predetermined angle appropriate to the candidate position. In this way, the operator can prepare a new register mark pattern only by specifying the numbers of rows and columns of the page layout and selecting a type of register mark at each candidate position.

The register mark pattern data is used in constructing a page layout with the aid of a computer, such as so called desk top publishing systems. The register mark pattern data can be also transferred to a drafting machine to draw the register mark on a sheet of paper to thereby make a block copy mount.

As for register marks which have the same configuration by rotation, only one configuration of a certain direction is required to be stored in the RAM 16, and this reduces the data to be prepared in advance.

The present invention is not confined to the embodiment described above but embodiments in various other manners are possible without departing from the scope of invention, and such variations as described below are possible.

Instead of the register mark position information table as shown in FIG. 5, a table as in FIG. 12(A) can be used. In the table of FIG. 5, the rotation angles θ for the candidate positions are registered respectively for each register mark; in the table of FIG. 12(A), the register marks are divided into groups and the rotation angles θ of the candidate positions are registered for each group. The X coordinates and Y coordinates are not shown in FIG. 12(A) for convenience of illustration. In the example in FIG. 12(A), the corner register marks are classified into two groups and the center register marks are also classified into two groups. The rotation angles θ for the register marks in the same group are equal to each other at each candidate position. When the register marks are divided into groups, the register mark group tables are also prepared as shown in FIGS. 12(B) through 12(E) where register marks are registered in respective groups. To rotate or reverse a register mark in steps S62 through S65 in FIG. 8, the group which the selected register mark belongs to is determined with reference to the register mark group tables shown in FIGS. 12(B) through 12(E), and the rotation or reverse operation is executed while utilizing the rotation angle information of the group included in the register mark position information table shown in FIG. 12(A). In FIG. 12(A), "x-axis reverse" means to reverse around the x axis, and "y=x line reverse" means to reverse around the y=x line.

Generally, many corner register marks have an equal rotation angle at each candidate position, and many center register marks also have an equal rotation angle at each candidate position. Therefore, the grouping of the register marks as shown in FIGS. 12(A) through 12(E) is advantageous in the reducing the amount of the rotation angle data in the register mark position information table, compared with that shown in FIG. 5.

The two register marks CT1 and CT2 in the corner register mark group 2 in FIG. 12(C) have configurations identical to each other by a 180-degree rotation. If the register mark CT1 is located at the candidate position Q02 in the upper left of FIG. 4, the mark CT1 will have the orientation shown in FIG. 12(C); if the register mark CT2 is located at the candidate position Q02, the mark CT2 will also have the orientation shown in FIG. 12(C). When one of a plurality of register marks, which are different only in their orientations, can be disposed at the same candidate position, the plurality of register marks may be registered in advance.

After the selection of the register mark in each of the candidate positions, the rotation angle of the selected register mark can be changed to an arbitrary angle if necessary. To execute this operation, the operator specifies an operation mode of changing rotation angle to change the rotation angle θ in the position-related data shown in FIG. 11(B). In the case where the rotation angle can be changed to an arbitrary angle, such as the corner register mark group 2 in FIG. 12(C), either of the two register marks CT1 and CT2 which are different only in their directions may be registered.

In the embodiments described above, the rotation angle data indicates a rotation angle or a rotation manner (x-axial reverse, etc.). Alternatively, coefficients of coordinate transformation to rotate or reverse end points of vectors constituting a register mark can be utilized as the rotation angle data.

According to the present invention, new register mark pattern data can be prepared easily by specifying the number of rows and columns of a page layout and selecting a desired type of register mark at each candidate position of the layout.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing a register mark pattern which is an arrangement of a plurality of register marks on a printing sheet area with the aid of a computer, comprising the steps of:
   (a) preparing register mark configuration data representing a plurality of register mark configurations;
   (b) specifying the number of columns M and the number of rows N indicating an M×N array of pages to be laid out on said printing sheet area;
   (c) determining a plurality of register mark candidate positions on said printing sheet area according to said numbers M and N;
   (d) displaying a page layout pattern and a register mark selection window on a display device, said page layout pattern including page symbols arranged in said M×N array and said plurality of register mark candidate positions laid out on said printing sheet area, said register mark selection window including representations of said plurality of register mark configurations;
   (e) selecting one of said plurality of register mark configurations displayed in said register mark selection window for at least part of said plurality of register mark candidate positions;
   (f) determining a rotation angle for each of the selected register mark configurations according to rotation angle data prepared in advance for said respective plurality of register mark configurations and according to a positional category of the register mark candidate position to which the selected register mark configuration is assigned, said rotation angle data indicating a rotation angle with respect to each positional category of the register mark candidate positions; and
   (g) producing register pattern data representing said selected register mark configurations disposed at said at least part of said plurality of register mark candidate positions on said printing sheet area, said selected register mark configurations being rotated by the respective rotation angles.

2. A method in accordance with claim 1, wherein said step (c) comprises the step of:
expressing coordinates of each of said plurality of register mark candidate positions on said printing sheet area with a plurality of positional parameters each having a default value.

3. A method in accordance with claim 2, wherein said positional parameters include a distance between said register mark candidate positions and said pages to be laid out in said M×N array, the dimensions of said pages, and a distance between said pages themselves.

4. A method in accordance with claim 1, wherein said step (c) comprises the step of:
producing register mark information including coordinates of each of said plurality of register mark candidate positions and said rotation angle data for said respective plurality of register mark configurations at each of said plurality of register mark candidate positions.

5. A method in accordance with claim 1, wherein said step (c) comprises the step of:
producing register mark information including coordinates of each of said plurality of register mark candidate positions and said rotation angle data for respective groups of said plurality of register mark configurations at each of said plurality of register mark candidate positions, each of said groups including at least one register mark configuration to which an identical rotational angle is applied.

6. An apparatus for preparing a register mark pattern which is an arrangement of register marks on a printing sheet area, comprising:
a first memory for storing register mark configuration data representing a plurality of register mark configurations;
a first input means for specifying the number of columns M and the number of rows N indicating an M×N array of pages to be laid out on said printing sheet area;
candidate position establishing means for establishing a plurality of register mark candidate positions on said printing sheet area according to said numbers M and N, and determining rotation angles for said respective plurality of register mark configurations at each of said plurality of register mark candidate positions;
a second memory for storing said plurality of register mark candidate positions and said rotation angles for said respective plurality of register mark configurations at each of said plurality of register mark candidate positions;
a display device for displaying a page layout pattern and a register mark selection window, said page layout pattern including page symbols arranged in said M×N array and said plurality of register mark candidate positions laid out on said printing sheet area, said register mark selection window including representations of said plurality of register mark configurations;
a second input means for selecting one of said plurality of register mark configurations displayed in said register mark display window, and selecting one of said plurality of register mark candidate positions to which said selected register mark configuration is assigned; and
register pattern data production means for producing register pattern data representing said selected register mark configurations disposed with the respective rotation angles at said plurality of register mark candidate positions on said printing sheet area.

7. An apparatus in accordance with claim 6, wherein each of said plurality of register mark candidate positions is expressed by coordinates on said printing sheet area with a plurality of positional parameters each having a default value.

8. An apparatus in accordance with claim 7, wherein said positional parameters include a distance between said register mark candidate positions and said pages to be laid out in said M×N array, the dimensions of said pages, and a distance between said pages themselves.

9. An apparatus in accordance with claim 6, wherein said candidate position establishing means produces a register mark information table including coordinates of each of said plurality of register mark candidate positions and said rotation angles for said respective plurality of register mark configurations at each of said plurality of register mark candidate positions.

10. An apparatus in accordance with claim 6, wherein said candidate position establishing means produces a register mark information table including coordinates of each of said plurality of register mark candidate positions and said rotation angles for respective groups of said plurality of register mark configurations at each of said plurality of register mark candidate positions, each of said groups including at least one register mark configuration to which an identical rotational angle is applied.

11. An apparatus for producing a register mark pattern which is an arrangement of a plurality of register marks on a printing sheet area, comprising:

a memory for storing register mark configuration data representing a plurality of register mark configurations;

first input means for specifying the number of columns M and the number of rows N indicating an M×N array of pages to be laid out on said printing sheet area;

candidate position determining means for determining a plurality of register mark candidate positions on said printing sheet area according to said numbers M and N;

a display device for displaying a page layout pattern and a register mark selection window, said page layout pattern including page symbols arranged in said M×N array and said plurality of register mark candidate positions laid out on said printing sheet area, said register mark selection window including representations of said plurality of register mark configurations;

second input means for selecting one of said plurality of register mark configurations displayed in said register mark selection window for at least part of said plurality of register mark candidate positions;

means for determining a rotation angle for each of the selected register mark configurations according to rotation angle data prepared in advance for said respective plurality of register mark configurations and according to a positional category of the register mark candidate position to which the selected register mark configuration is assigned, said rotation angle data indicating a rotation angle with respect to each positional category of the register mark candidate positions; and means for producing register pattern data representing said selected register mark configurations disposed with the respective rotation angles at said at least part of said plurality of register mark candidate positions on said printing sheet area.

12. An apparatus in accordance with claim 11, wherein
each of said plurality of register mark candidate positions is expressed by coordinates on said printing sheet area with a plurality of positional parameters each having a default value.

13. An apparatus in accordance with claim 12, wherein
said positional parameters include a distance between said register mark candidate positions and said pages to be laid out in said M×N array, the dimensions of said pages, and a distance between said pages themselves.

14. An apparatus in accordance with claim 11, wherein
said candidate position determining means produces a register mark information table including coordinates of each of said plurality of register mark candidate positions and said rotation angles for said respective plurality of register mark configurations at each of said plurality of register mark candidate positions.

15. An apparatus in accordance with claim 11, wherein
said candidate position determining means produces a register mark information table including coordinates of each of said plurality of register mark candidate positions and said rotation angles for respective groups of said plurality of register mark configurations at each of said plurality of register mark candidate positions, each of said groups including at least one register mark configuration to which an identical rotational angle is applied.

* * * * *